United States Patent
Kimura et al.

(10) Patent No.: US 9,823,587 B2
(45) Date of Patent: Nov. 21, 2017

(54) LITHOGRAPHY APPARATUS, STAGE APPARATUS, AND METHOD OF MANUFACTURING ARTICLES

(71) Applicant: CANON KABUSHIKI KAISHA, Tokyo (JP)

(72) Inventors: Tadashi Kimura, Chikusei (JP); Nobushige Korenaga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 71 days.

(21) Appl. No.: 14/671,898

(22) Filed: Mar. 27, 2015

(65) Prior Publication Data

US 2015/0277229 A1    Oct. 1, 2015

(30) Foreign Application Priority Data

Mar. 31, 2014  (JP) ................................. 2014-074064

(51) Int. Cl.
*G03F 7/20* (2006.01)

(52) U.S. Cl.
CPC ...... *G03F 7/70716* (2013.01); *G03F 7/70725* (2013.01); *G03F 7/70758* (2013.01); *G03F 7/70775* (2013.01); *G03F 7/70816* (2013.01); *G03F 7/704* (2013.01); *G03F 7/70841* (2013.01)

(58) Field of Classification Search
CPC .. G03F 7/704; G03F 7/70716; G03F 7/70725; G03F 7/70758; G03F 7/70775; G03F 7/70816; G03F 7/70841
See application file for complete search history.

(56) References Cited

U.S. PATENT DOCUMENTS

2004/0080730 A1* 4/2004 Binnard ................. G03B 27/42
                                                                   355/53
2013/0293865 A1* 11/2013 Ummethala ............ H01J 37/20
                                                                   355/75

FOREIGN PATENT DOCUMENTS

JP           2004-363259 A      12/2004

* cited by examiner

*Primary Examiner* — Michelle M Iacoletti
(74) *Attorney, Agent, or Firm* — Canon U.S.A., Inc. IP Division

(57) ABSTRACT

This disclosure provides a lithography apparatus including: a lens barrel having an optical system configured to irradiate a substrate with a beam; and a stage apparatus configured to repeat a long distance movement in a primary scanning direction of the substrate and a short distance movement which is shorter than the long distance movement in terms of the amount of movement in a secondary scanning direction of the substrate, and being configured to form a pattern on the substrate with the beam, wherein the stage apparatus includes: a first moving body configured to move in the primary scanning direction; a floating unit configured to support the first moving body, so as to float by a magnetic force and be movable in the primary scanning direction; a second moving body configured to move in the secondary scanning direction; and a guide using a rolling body configured to support the second moving body in contact therewith so as to be movable in the secondary scanning direction.

9 Claims, 4 Drawing Sheets

LITHOGRAPHY APPARATUS, STAGE APPARATUS, AND METHOD OF MANUFACTURING ARTICLES

BACKGROUND OF THE INVENTION

Field of the Invention

This disclosure relates to a lithography apparatus, a stage apparatus, and a method of manufacturing articles.

Description of the Related Art

In recent years, in association with miniaturization of patterns of semiconductor integrated circuits, a lithography apparatus configured to form a pattern on a substrate under vacuum such as a EUV exposure apparatus and an electron beam drawing apparatus has been in development. A technology to use a linear motor as a moving device configured to retain a substrate and move a stage in biaxial direction in a horizontal plane and a hydrostatic bearing as a retaining device when guiding the movement of the stage is known (Japanese Patent Laid-Open No. 2004-363259). The hydrostatic bearing disclosed in Japanese Patent Laid-Open No. 2004-363259 is provided with a mechanism configured to collect exhaust air by using three vacuum pockets in order to prevent gas pressure from lowering due to evacuation of air from the hydrostatic bearing.

There is an electron beam drawing apparatus configured to form a pattern by repeating a series of actions of a stage including moving by a long distance (long distance movement) in a primary scanning direction, moving by a short distance (short distance movement) in a secondary scanning direction, which is a direction orthogonal to the primary scanning direction, and moving back by a long distance (long distance movement) in the primary scanning direction.

SUMMARY OF THE INVENTION

This disclosure is intended to provide a lithography apparatus and a stage apparatus which achieve both improvement of throughput and reduction of costs by using a supporting device which meets a direction of movement of a stage and conditions of movement in the direction in question.

According to an aspect of the present invention, there is provided a lithography apparatus including: a lens barrel having an optical system configured to irradiate a substrate with a beam; and a stage apparatus configured to repeat a long distance movement in a primary scanning direction of the substrate and a short distance movement which is shorter than the long distance movement in terms of the amount of movement in a secondary scanning direction of the substrate, and being configured to form a pattern on the substrate with the beam, wherein the stage apparatus includes: a first moving body configured to move in the primary scanning direction; a floating unit configured to support the first moving body so as float by a magnetic force and to be movable in the primary scanning direction; a second moving body configured to move in the secondary scanning direction; and a guide using a rolling body configured to support the second moving body in contact therewith so as to be movable in the secondary scanning direction.

Further features of the present invention will become apparent from the following description of exemplary embodiments with reference to the attached drawings.

DESCRIPTION OF THE EMBODIMENTS

Figure 1A:
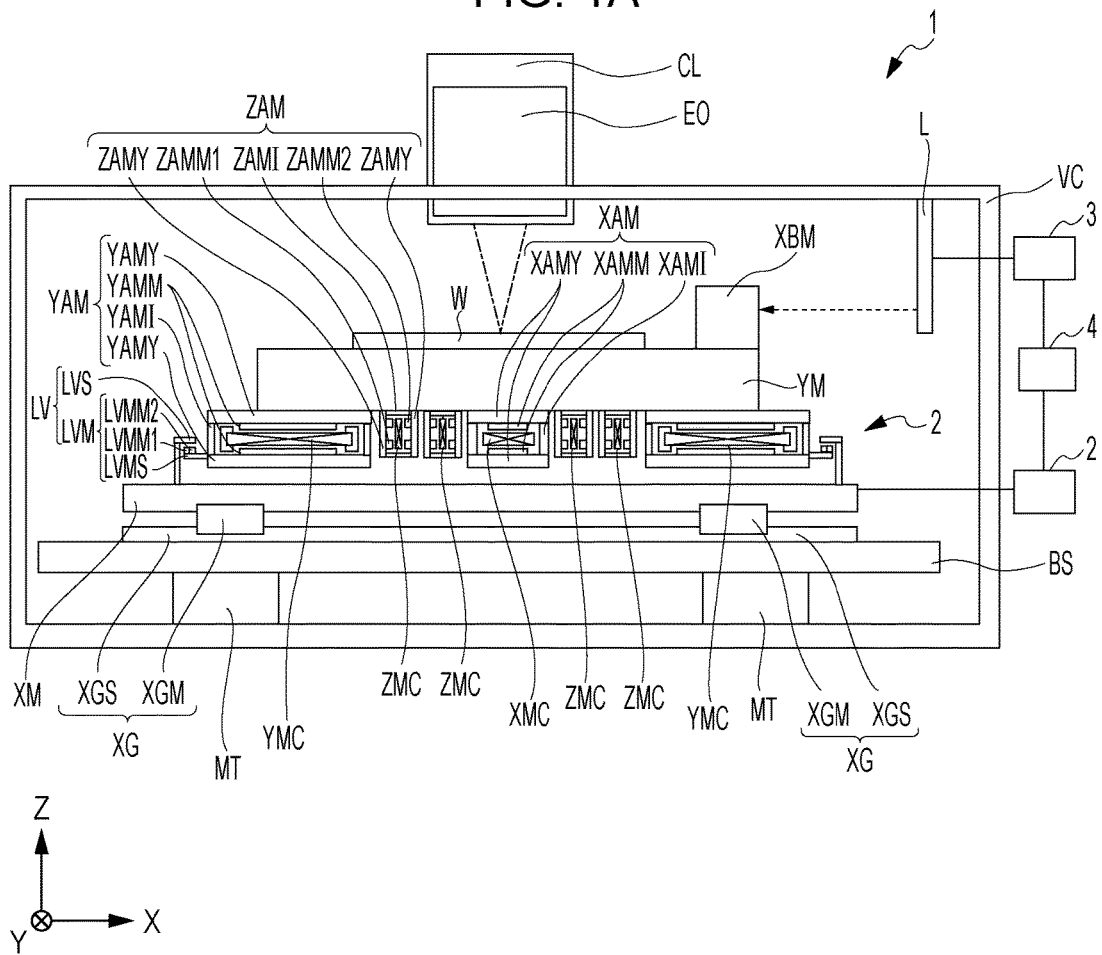
FIGS. 1A and 1B are configuration drawings of a drawing apparatus having a stage of a first embodiment.

A stage apparatus 2 of first embodiment will be described with reference to FIGS. 1A and 1B. FIG. 1A is a front view of a drawing apparatus (lithography apparatus) 1 configured to form a pattern by irradiating a wafer (substrate) W having resist applied thereto with an electron beam. A configuration of the stage apparatus 2 with respect to a Y-axis direction will be described later with reference to FIGS. 2A and 2B.

A lens barrel CL includes an electron source (not illustrated) configured to generate the electron beam and an electronic optical system (optical system) EO configured to converge the electron beam emitted from the electron source on the wafer W. In addition, the lens barrel CL is installed so as to penetrate through a vacuum chamber VC, and an interior of the vacuum chamber VC and an interior of the lens barrel CL are maintained in a high vacuum atmosphere by using a vacuum pump (not illustrated). A gas pressure in the periphery of a stage XM and a stage YM described later, which move in the vacuum chamber VC, is not higher than $1 \times 10^{-2}$ Pa and not lower than $1 \times 10^{-6}$ Pa, for example.

A bottom portion in the vacuum chamber VC includes a platen BS as a base and a mount MT configured to support the platen BS and reduce external vibrations transmitted to the platen BS. The stage XM (a second moving body) movable in an X-axis direction (a secondary scanning direction, a second direction) is provided on the platen BS. A stage YM (a first moving body) facing the stage XM, and movable in the X-axis direction, the Y-axis direction (a primary scanning direction, a first direction), and a Z-axis direction in a state of retaining the wafer W is provided above the stage XM. The control unit 2 is configured to control an actuator (not illustrated) configured to move the stage XM and the stage YM.

A mirror XBM used for measuring the position in the X-axis direction is provided on the stage YM. An interferometer L suspended from the vacuum chamber VC is configured to emit a laser beam toward the mirror XBM and detect an interfering light between the laser beam reflected by the mirror XBM and reference light. The interferometer L measures displacement of the stage YM in the X-axis direction on the basis of a change in intensity of the interfering light. Displacements in the Y-axis direction and the Z-axis direction may also be measured by a mirror YBM (illustrated in FIG. 2A) and a mirror (not illustrated) for the Z-axis direction in the same manner. From the result of detection by the interferometer L, a detector 3 outputs the positions of the stage YM in the X-axis, Y-axis, and Z-axis directions.

A main control unit 4 is connected to the control unit 2 and the detector 3. The main control unit 4 instructs amounts of movement required for the stage XM and the stage YM to the control unit 2 on the basis of the result of measurement of the detector 3. On the basis of the instruction from the main control unit 4, the control unit 2 moves the stage XM and the stage YM synchronously, so that the position of the stage YM in the six-axis directions (X, Y, Z, ωx, ωy, and ωz) can be controlled.

Figure 1B:
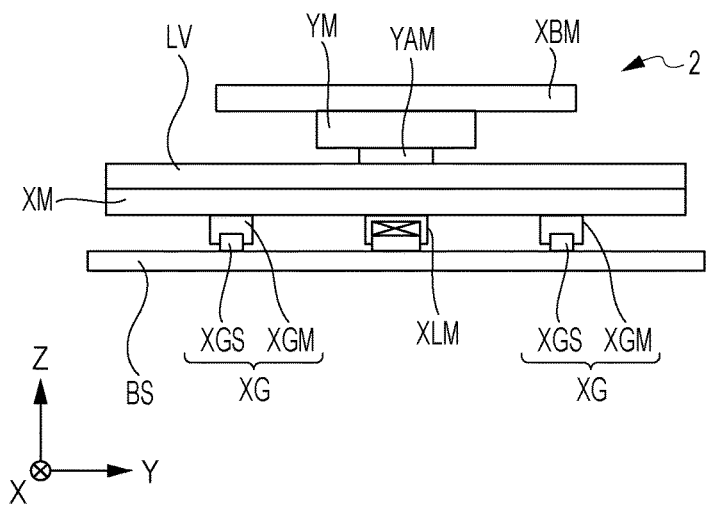

The stage XM moves on the platen BS in the X-axis direction by a linear motor XLM (illustrated in FIG. 1B). A guide (a second guide) (hereinafter, referred to as a linear guide) XG using a mechanism, in which a rolling body rolls, guides the movement of the stage XM in the X-axis direction while supporting the stage XM in contact with the platen BS. The linear guide XG includes a guide shaft XGS and a slider XGM. The stage apparatus 2 of this embodiment includes four of the sliders XGM in total including two in the X-axis direction as illustrated in FIG. 1A and two in the Y-axis direction as illustrated in FIG. 1B.

The stage YM is moved by a linear motor mechanism including magnet units XAM, YAM, and ZAM described later and coils XAC, YAC, and ZAC corresponding to the respective magnet units. A floating unit LV (a first guide) illustrated in FIG. 1A guides the movement of the stage YM in the Y-axis direction while supporting the stage YM so as to float with respect to the stage XM (the first moving body is located above the second moving body). The floating unit LV includes a fixed portion LVS fixed to the stage XM located downward (downward of the first moving body) and a movable portion LVM configured to move together with the stage YM while being floated by a magnetic force with respect to the fixed portion LVS.

The movable portion LVM includes a retaining portion LVMS, and permanent magnets LVMM1 and LVMM2 having a parallelepiped shape with an elongated direction corresponding to the Y-axis direction. The permanent magnet LVMM1 and the permanent magnet LVMM2 are magnetized in directions opposite to each other in the vertical direction. Materials of the fixed portion LVS and the retaining portion LVMS are materials having high magnetic permeability such as iron and nickel alloy. Due to magnetic attracting forces of the permanent magnet LVMM1 and the permanent magnet LVMM2 acting with respect to the fixed portion LVS, the stage YM may maintain a floating state.

The linear guide XG is provided at a low cost among contact type supporting devices. The floating unit LV may achieve a low cost in comparison with the case where the hydrostatic bearing is used even when being used under vacuum.

The floating unit LV may provide high-speed movement of the stage YM in comparison with the hydrostatic bearing, which is known as the non-contact type guide. In the case where the hydrostatic bearing is applied, the stage YM can be floated by a distance on the order of 5 μm. In contrast, with a floating supporting device using the magnetic force, the stage YM may be floated by 0.5 to 10 mm and, the floating supporting device could reduce risk of contact with a floated upper surface (the stage XM in this embodiment) even by the high-speed movement.

An actuator configured to move the stage YM is arranged on a bottom surface of the stage YM. There are the magnet units XAM, YAM, and ZAM as a movable element of the actuator. The magnet unit XAM moves the stage YM in the X-axis direction, and two of the magnet units YAM move the stage YM in the Y-axis direction, and four of the magnet units ZAM move the stage YM in the Z-axis direction. The respective magnet units XAM, YAM, and ZAM have a hollow structure so as to allow the coils XAC, YAC, and ZAC, which are fixed elements of the actuator corresponding to the respective magnet units XAM, YAM, and ZAM, to pass therethrough.

The magnet unit YAM includes magnets YAMM above and below the coil YAC, and yokes YAMY are positioned arranged above and below each of the magnets YAMM. The yokes YAMY are fixed to each other with an intermediate member YAMI. The magnets YAMM having different magnetic polarities are arranged alternately in the Y-axis direction.

Magnets ZAMM1 and magnets ZAMM2 of the magnet unit ZAM are each a magnet pair having opposite magnetic polarities. Yokes ZAMY are arranged on side surfaces of the magnets ZAMM1 and ZAMM2, and the yokes ZAMY are fixed to each other with an intermediate member ZAMI.

The magnet unit XAM includes magnets XAMM located above and below the coil XAC, yokes XAMY arranged above and below the magnet XAMM, and an intermediate member XAMI fixed so as to couple the yokes XAMY. The magnets XAMM are magnets having opposite magnetic polarities in the X-axis direction.

Figure 2A:
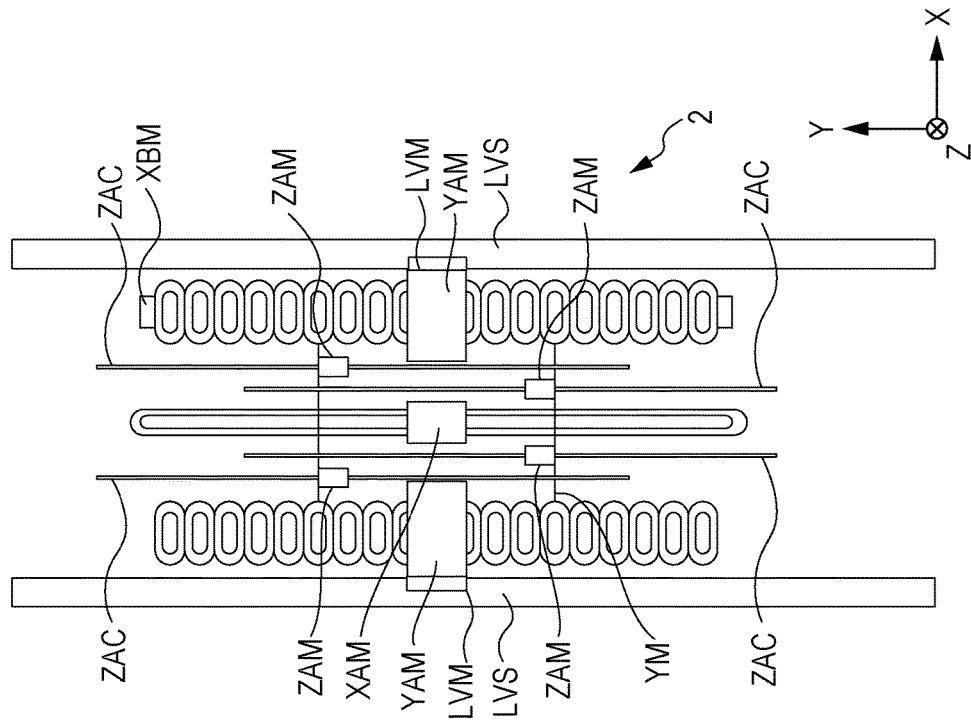
FIGS. 2A and 2B are drawings of a stage YM viewed in a vertical direction.

Subsequently, a drawing of the stage YM viewed from above in the vertical direction is illustrated in FIG. 2A. At a center of the lens barrel CL, an emission port BA of an electron beam is illustrated. The width of the emission port BA falls within a range from 60 μm to 200 μm. A drawing of the stage YM viewed from the stage XM is illustrated in FIG. 2B.

The coil XAC is a single-phase oval coil, and has a shape elongated in the Y-axis direction on an XY plane. The coil ZAC is also a single-phase oval coil, and is arranged so that a plane formed by the coil ZAC forms a right angle with a plane formed by the coil XAC. In contrast, the coil YAC is formed of a multi-phase coil, and has a configuration that may achieve a long distance movement of the stage YM in the Y-axis direction.

The control unit 2 flows a current to the coil XAC, and moves the magnet unit XAM and the stage YM in the X-axis direction by an electromagnetic force. Control of the movement of the stage YM in the X-axis direction by the control unit 2 is performed not only for fine-adjusting the position in the X-axis direction, but also for moving the stage YM in conjunction with the stage XM so as to follow the movement of the stage XM. In the same manner, the control unit 2 flows a current to the coil ZAC, and moves the magnet unit ZAM and the stage YM in the Z-axis direction. In addition, the control unit 2 flows a current to a predetermined coil of the coil YAC in accordance with the position of the stage YM to move the magnet unit YAM and the stage YM in the Y-axis direction.

Figure 2B:
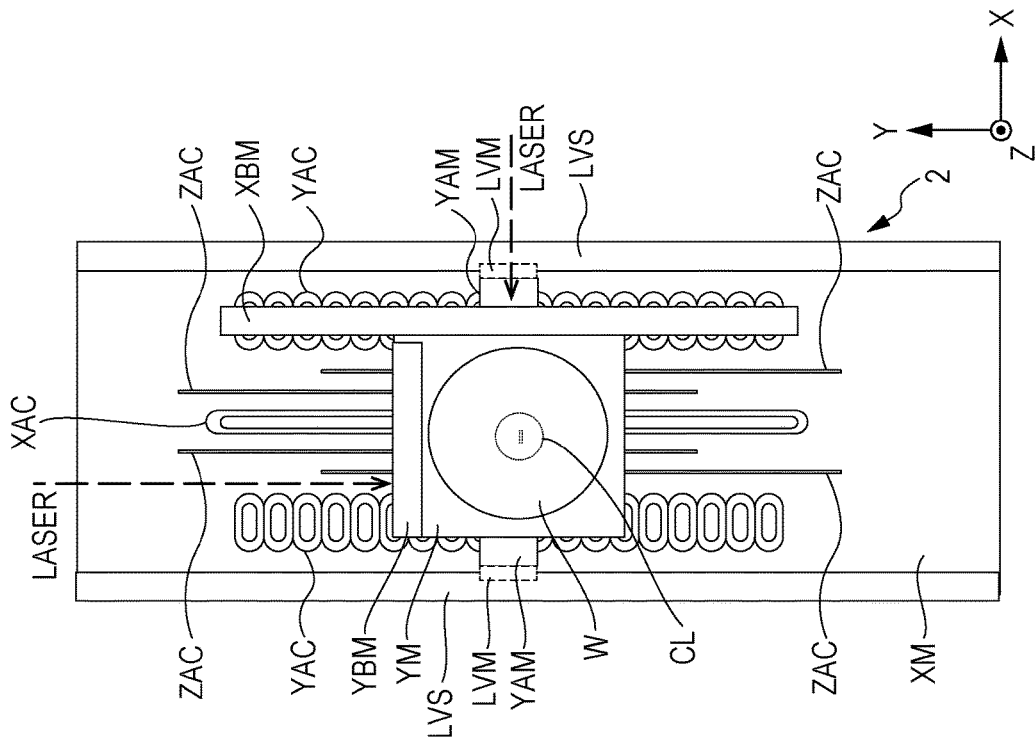

As illustrated in FIG. 2B, the respective coils of the coil ZAC are arranged apart from each other in the X-axis direction and the Y-axis direction. Accordingly, the inclination of the stage YM may be controlled in accordance with fine concavities and convexities on a surface of the wafer W during drawing. In this manner, on the basis of an instruction from the control unit 2, the position of the stage YM is controlled by the amount of a current flowing to the respective coils, and the direction and timing of the current.

Figure 3:
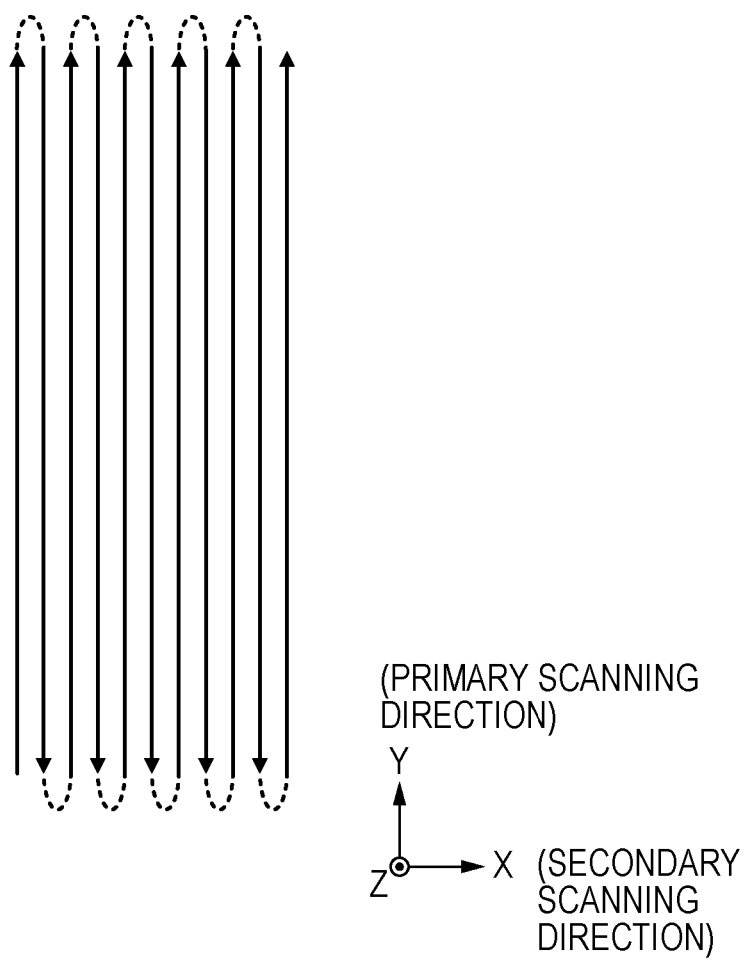
FIG. 3 is a drawing illustrating a movement locus of the stage YM.

With the configuration described above, the stage XM moves in the X-axis direction while being supported by the linear guide XG, and the stage YM moves in the Y-axis direction while being supported by the floating unit LV. By the movements of the stage XM and the stage YM, the wafer W draws a locus as illustrated in FIG. 3. A scanning action (a solid line portion) which makes a long distance movement in the Y-axis direction while drawing the pattern with the electron beam, and a stepping action (a broken line portion) which makes a short distance movement in the X-axis direction by an amount of movement smaller than the long distance movement in the Y-axis direction while the electron beam is not irradiated are repeated. During the stepping action, a component of movement in the Y-axis direction is also included, and hence the locus shows a U-turn.

In the case where the pattern is drawn to the wafer W having a diameter of 300 mm, and the electron beam is not irradiated to the wafer W during acceleration and deceleration, a distance of movement in the Y-axis direction per one scanning action will fall within a range from 500 mm to 1000 mm. The distance of movement varies in accordance with the velocity at the time of acceleration and deceleration. In contrast, the distance of movement in the X-axis direction per one stepping action is 200 µm in the case where the width of an irradiated region is 200 µm.

When the drawing apparatus 1 draws a pattern with a width of the irradiated region of 200 µm on a one wafer, the total distance of movement until the completion of the drawing on one wafer W will be described. In the case where the pattern is formed on the wafer W having a diameter of 300 mm without performing alignment measurement during drawing the pattern, the movement in the X-axis direction is only 400 mm at the maximum.

In contrast, when it is assumed that the distance of movement per one scanning action is constant, the total distance of movement in the Y-axis direction may be a range from 1000000 to 2000000 mm. In other words, when processing one wafer, the total distance of movement in the X-axis direction is only 1/5000 to 1/2500 the total distance (not longer than 1/500 a total distance) of movement in the Y-axis direction.

In the case where the width of the irradiated region is smaller than 200 µm, the total distance of movement in the Y-axis direction is further smaller than the above-described values. Even if the width of the irradiated region is larger than 200 µm, the distance of movement of the stage YM in the X-axis direction is only 1/500 the distance of movement in the Y-axis direction or less.

In order to improve throughput, the movement of the stage YM in the Y-axis direction is performed at a high-speed. For example, the maximum speed is 1000 mm/s, more preferably, speeds from 1500 mm/s to 2500 mm/s. The movement in the X-axis direction is little, and a high-speed cannot be achieved with one stepping action in the X-axis direction, and hence the maximum speed is 5 mm/s. More preferably, the maximum speed of the movement in the X-axis direction is 2 mm/s. These values are set for restraining generation of particles from the linear guide XG and reducing lowering of a degree of vacuum in the chamber VC and lowering of a drawing precision caused by the lowering of the degree of vacuum.

In the case of the stage configuration of this embodiment, as regards the velocity of the movement in the X-axis direction, the velocity and the distance of movement per one stepping action is small. In contrast, as regards the movement in the Y-axis direction, the velocity and the distance of movement per one scanning action are larger than the movement in the X-axis direction. In other words, the stage apparatus 2 employs a movement system in which the amount of movement in the X-axis direction of is relatively shorter than the amount of movement in the Y-axis direction, and the velocity of movement in the X-axis direction is relatively lower than the velocity of movement in the Y-axis direction.

With such a movement, the velocity of movement in the X-axis direction is low and hence the usage of a non-contact guide is not required. Since the distance of movement is short, a high durability is not required. Therefore, the contact-type linear guide XG can be used as the supporting device for the stage XM. Accordingly, a cost reduction is achieved in comparison with the case where the movement is guided by using other supporting devices.

In addition, by guiding the movement in the Y-axis direction while supporting the movement by using the floating unit LV, improvement of throughput is achieved in comparison with the case where the hydrostatic bearing with an exhaust mechanism is used.

Assuming that the same moving devices are employed for two axial directions, the linear guides cannot accommodate an increase in velocity, which may result not only in lowering of the throughput, but also in severe abrasion caused by a high speed movement and shorter lifetime. In the case where the floating stages are used for both of two axes, two sets of the six-axis interferometers are required, and hence an increase in cost may result. In addition, even though the velocity of the movement in the X-axis direction is increased, it has not so significant contribution to the improvement of the throughput, and hence a dramatic improvement of the throughput cannot be achieved.

In the case where the hydrostatic bearing is used for the apparatus configured to move the stage YM in a vacuum chamber instead of floating unit LV and linear guide XG, collection of the exhaust gas generated from the hydrostatic bearing cannot be in time, which may cause a risk of lowering of the degree of the vacuum. Furthermore, in the case where the hydrostatic bearing is used, unnecessary costs may be required because total distance of movement in the secondary scanning direction is short so that it may not need support in non-contact manner, which likely to be expensive.

From these reasons, it is necessary to use the supporting device in accordance with the conditions of movement such as a direction of movement of the stage, and the velocity and the distance of movement in the direction. As in this embodiment, by selectively using two types of supporting devices, namely, the supporting device on the basis of the magnetic force and the contact support on the basis of the linear guide in accordance with the conditions of movement, both of improvement of throughput and reduction of cost are achieved in comparison with the case where only one type of supporting device is used.

Figure 4:
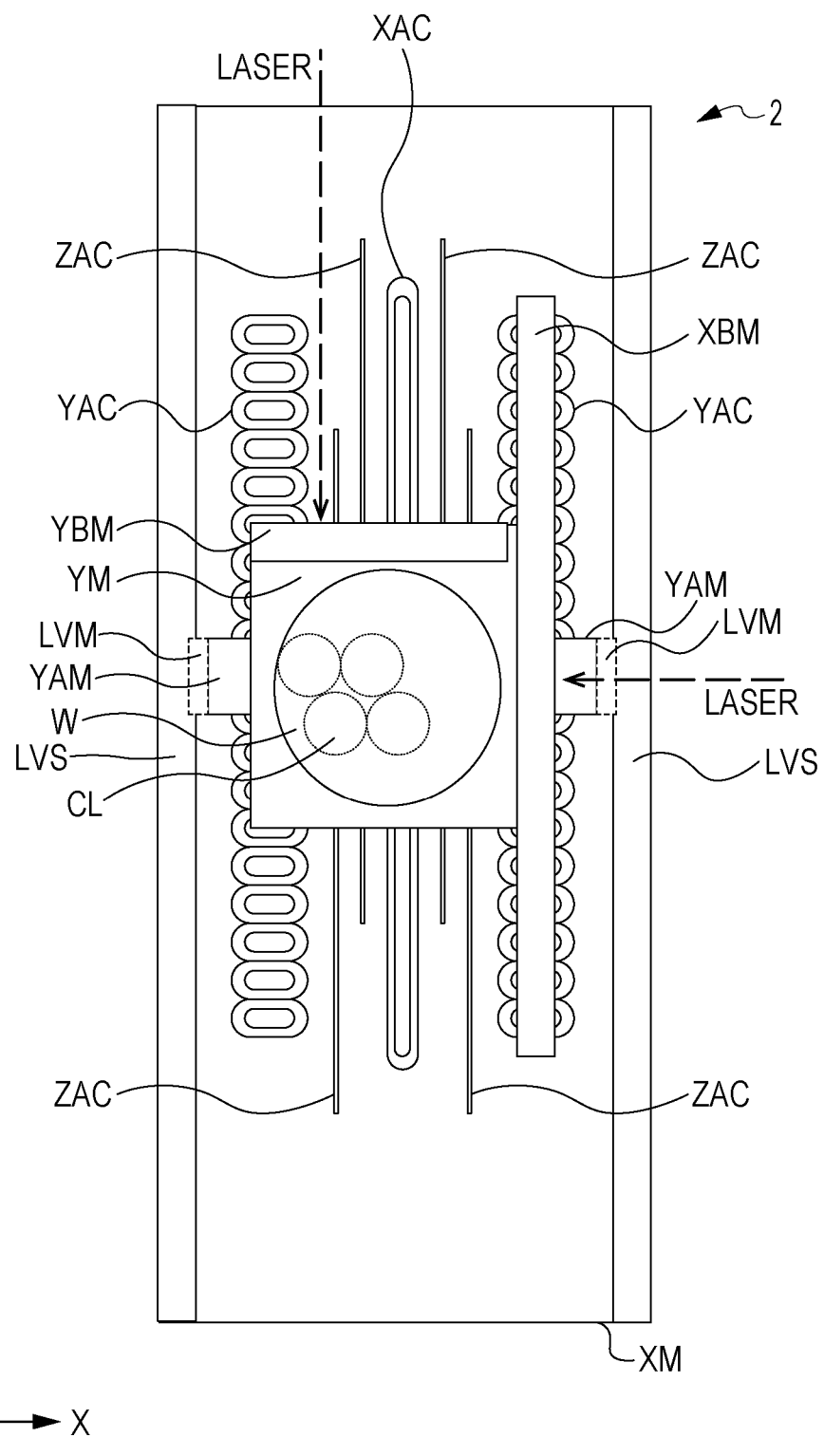
FIG. 4 is a drawing for explaining the stage of a second embodiment.

FIG. 4 illustrates the drawing apparatus 1 having the stage apparatus 2 of a second embodiment when viewing the stage YM from above in the vertical direction. The second embodiment is different from the first embodiment in that drawing is performed with electron beams emitted from four of the lens barrels CL to the single wafer W. The number of the lens barrels that emit the electron beams is quadruplicated, and the width in the X-axis direction which can be drawn at the same time is also quadruplicated correspondingly. By arranging the four lens barrels CL at adequate intervals so that the drawing region of the four lens barrels CL is obtained by integral multiplication of a drawing region drawn by the single lens barrel CL, the total amount of movement of the stage XM can be reduced to approximately ¼.

Accordingly, the distance of movement of the linear guide XG of the contact system is reduced. In other words, by providing a plurality of the lens barrels, the speed of abrasion of the linear guide XG is reduced, and even though particles are generated in the vacuum chamber VC, the amount of generation thereof can be reduced. In addition, by increasing the number of the lens barrel CL, a surface area that can be drawn at one time is increased, and an effect of improvement of the throughput is also obtained correspondingly. In this manner, a system of movement in which the amounts of movement in the respective directions of movement are different from each other is effectively used and, in addition, improvement of throughput is achieved.

Other Embodiments will be described.

Either one of the stage configured to be moved by being supported by a magnetic force in a non-contact manner or the stage configured to be moved by being supported by the linear guide in a contact manner may come above. However, a configuration in which the stage configured to be moved by being supported by the magnetic force as in the embodiment described above comes above is preferable. Because, if they are arranged vice versa, it is necessary to prepare a strong magnetic body for floating the stage against the gravitational force thereof, or to apply a larger motive force to an actuator mechanism for a movement in the Z-axis direction.

The actuator configured to move the stage XM is preferably the linear motor mechanism from viewpoints of high positioning accuracy, good responsiveness, and superior abrasion resistance. However, other actuator mechanisms may also be employed. If the durability at least until maintenance of the drawing apparatus 1 is ensured, an actuator mechanism (a combination of a rotary motor and a ball screw, a combination of a rotary motor, a cam, and a link, and the like) configured to convert a rotary motion by the rotary motor to a linear motion is also applicable. If a desired positioning accuracy may be obtained even in the case where these actuator is used, reduction of cost of the stage apparatus 2 may result.

The stage apparatus 2 may include the stage XM, the stage YM, the magnet units XAM and YAM, the coils XAC and YAC, the linear guide XG, the linear motor XLM, and at least one of the floating unit LV and the actuator having the magnet unit ZAM and the coil ZAC. The floating support by the magnetic force is achieved not only by the floating unit LV, but also by using the actuator configured to move in the Z-axis direction also as the floating unit, or using the actuator configured to move in the Z-axis direction as a substitution. However, the actuator configured to move in the Z-axis direction preferably has a configuration of being used only for correcting inclination of an irradiating surface in accordance with the concavity and convexity of the wafer W or being able to be used also as the floating unit LV because a current to be flowed to the coil ZAC may be reduced. Accordingly, heat generation of the coil ZAC can be restrained, and thermal deformation of the wafer W may also be restrained.

The stage apparatus of the invention is not limited to the drawing apparatus using the electron beam as a beam, but also may be applied to a lithography apparatus configured to form patterns by irradiating beams such as KrF or EUV, an ion beam, or a laser beam, or a lithography apparatus configured to form patterns by using an imprinting method. The invention may also be applied to other processing apparatus having a stage apparatus configured to move while retaining a substrate. In particular, the invention is suitable specifically in the case where the selectable supporting device is subject to more constraints than under the atmospheric pressure such as an interior of the vacuum chamber or in the case where conditions of movement with respect to the two-axial directions are different.

Method of Manufacturing Articles

A method of manufacturing articles (semiconductor integrated circuit elements, liquid crystal display devices, CD-RW, photo mask etc.) includes exposing a pattern on a substrate (a wafer or a glass plate) by using the stage apparatus of the embodiments described above, and developing the exposed substrate. Furthermore, other known processes (oxidization, film formation, depositing, etching, ion infusion, flattening, resist separation, dicing, bonding, packaging, and the like) may be included.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-074064, filed Mar. 31, 2014, which is hereby incorporated by reference herein in its entirety.

What is claimed is:

1. A lithography apparatus for forming a pattern on a substrate comprising:
   a barrel having an optical system configured to irradiate the substrate; and
   a stage apparatus configured to move the substrate in a first direction and a second direction across the first direction,
   wherein the stage apparatus includes:
      a first moving body configured to move in the first direction;
      a second moving body configured to move in the second direction;
      a floating unit configured to support the first moving body, so as to float by a magnetic force above the second moving body and be movable in the first direction;
      a guide using a rolling body configured to support the second moving body in contact with the base and the second moving body so as to be movable in the second direction; and
      a control unit configured to control positions of the first moving body and the second moving body,
      wherein the control unit is configured to control first movement, in the first direction, of the first moving body supported by the floating unit while the substrate is irradiated and is configured to control second movement, in the second direction, of the second moving body supported by the guide while the substrate is not irradiated after the first movement,
      wherein the first movement and the second movement are repeatedly performed,
      wherein one movement amount of the first movement is larger than one movement amount of the second movement.

2. The lithography apparatus according to claim 1, further comprising a vacuum chamber,
   wherein the stage apparatus is configured to move the substrate within the vacuum chamber.

3. The lithography apparatus according to claim 1, further comprising a control unit configured to control the movement of the stage apparatus,
   wherein the control unit controls a maximum speed of the first moving body in the first movement so that the maximum speed is not lower than a speed of 1000 mm/s.

4. The lithography apparatus according to claim 1, further comprising a control unit configured to control the movement of the stage apparatus,
   wherein the control unit controls a maximum speed of the second moving body in the second movement so that the maximum speed is not higher than a speed of 5 mm/s.

5. The lithography apparatus according to claim 1, wherein the floating unit includes a permanent magnet provided on the first movable body and a magnetic member provided so as to be fixed to a lower portion of the first movable body.

6. The lithography apparatus according to claim 1, comprising a plurality of the barrels.

7. A method of manufacturing articles comprising:
irradiating a substrate with a beam by using a lithography apparatus; and
applying at least one of etching and ion injection to the substrate, wherein the lithography apparatus includes:
a barrel having an optical system configured to irradiate the substrate; and
a stage apparatus configured to move the substrate in a first direction and a second direction across the first direction,
wherein the stage apparatus includes:
a first moving body configured to move in the first direction;
a second moving body configured to move in the second direction;
a floating unit configured to support the first moving body, so as to float by a magnetic force above the second moving body and be movable in the first direction; and
a guide using a rolling body configured to support the second moving body in contact with the base and the second moving body so as to be movable in the second direction,
a control unit configured to control positions of the first moving body and the second moving body,
wherein the control unit is configured to control first movement, in the first direction, of the first moving body supported by the floating unit while the substrate is irradiated and is configured to control second movement, in the second direction, of the second moving body supported by the guide while the substrate is not irradiated after the first movement,
wherein the first movement and the second movement are repeatedly performed,
wherein one movement amount of the first movement is larger than one movement amount of the second movement.

8. A lithography apparatus for forming a pattern on a substrate comprising:
a barrel having an optical system configured to irradiate the substrate; and
a stage apparatus configured to move the substrate in a first direction and a second direction across the first direction,
wherein the stage apparatus includes:
a first moving body configured to move in the first direction;
a second moving body configured to move in the second direction;
a floating unit configured to support the first moving body, so as to float by a magnetic force above the second moving body and be movable in the first direction; and
a guide using a rolling body configured to support the second moving body in contact with the base and the second moving body so as to be movable in the second direction,
a control unit configured to control positions of the first moving body and the second moving body,
wherein the control unit is configured to control first movement, in the first direction, of the first moving body supported by the floating unit while the substrate is irradiated and is configured to control second movement, in the second direction, of the second moving body supported by the guide while the substrate is not irradiated after the first movement,
wherein the first movement and the second movement are repeatedly performed,
wherein maximum speed of the first moving body in the first movement is larger than maximum speed of the second moving body in the second movement.

9. A method of manufacturing articles comprising:
irradiating a substrate by using a lithography apparatus; and
applying at least one of etching and ion injection to the substrate,
wherein the lithography apparatus includes:
a barrel having an optical system configured to irradiate the substrate; and
a stage apparatus configured to move the substrate in a first direction and a second direction across the first direction,
wherein the stage apparatus includes:
a first moving body configured to move in the first direction;
a second moving body configured to move in the second direction;
a floating unit configured to support the first moving body, so as to float by a magnetic force above the second moving body and be movable in the first direction; and
a guide using a rolling body configured to support the second moving body in contact with the base and the second moving body so as to be movable in the second direction,
a control unit configured to control positions of the first moving body and the second moving body,
wherein the control unit is configured to control first movement, in the first direction, of the first moving body supported by the floating unit while the substrate is irradiated and is configured to control second movement, in the second direction, of the second moving body supported by the guide while the substrate is not irradiated after the first movement,
wherein the first movement and the second movement are repeatedly performed,
wherein maximum speed of the first moving body in the first movement is larger than maximum speed of the second moving body in the second movement.

* * * * *